(12) United States Patent
Inaba et al.

(10) Patent No.: US 7,015,705 B2
(45) Date of Patent: Mar. 21, 2006

(54) CAPACITANCE DETECTION APPARATUS (75) Inventors: Hisashi Inaba, Kariya (JP); Kohei Kurachi, Nishio (JP); Rikuo Hatano, Toyota (JP)

(73) Assignee: Aisin Seiki Kabushiki Kaisha, Kariya (JP)

( * ) Notice: Subject to any disclaimer, the term of this patent is extended or adjusted under 35 U.S.C. 154(b) by 0 days.

(21) Appl. No.: 10/951,883

(22) Filed: Sep. 29, 2004

(65) Prior Publication Data
US 2005/0068045 A1    Mar. 31, 2005

(30) Foreign Application Priority Data
Sep. 30, 2003  (JP) .............................. 2003-341063

(51) Int. Cl.
*G01R 27/26*   (2006.01)
(52) U.S. Cl. ..................... 324/678; 324/658; 324/76.16
(58) Field of Classification Search ................ 324/678, 324/658, 679
See application file for complete search history.

(56) References Cited

U.S. PATENT DOCUMENTS 3,886,447 A    5/1975   Tanaka (Continued)

FOREIGN PATENT DOCUMENTS

DE    100 10 946 A1    9/2001

(Continued)

OTHER PUBLICATIONS

European Patent Office Search Report.

*Primary Examiner*—Anjan Deb
*Assistant Examiner*—Jeff Natalini
(74) *Attorney, Agent, or Firm*—Buchanan Ingersoll PC (Including attorneys from Burns Doane Swecker & Mathis)

(57) ABSTRACT

A capacitance detection apparatus includes a first open/close switch provided between both ends of a standard capacitor, one end of the standard capacitor being connected to a first voltage source, a second open/close switch provided between one end of a first capacitor to be measured and the other end of the standard capacitor, the other end of the first capacitor to be measured being connected to a second voltage source or free space, a third open/close switch provided between both ends of the first capacitor to be measured, a voltage measurement means for measuring voltage of the other end of the standard capacitor, a switch control means for performing a first switching control performing a first switching operation to open the first open/close switch after closing thereof, performing a second switching operation to open the second open/close switch after closing thereof, and a third switching operation to close the third open/close switch after closing thereof, wherein the second and third switching operations are repeatedly performed after the first switching operation, a counting means for counting the number of repetition of the second switching operation, and a judging means for judging a change of the capacitance of the first capacitor to be measured according to the number of repetition of the second switching operation, which is the number counted by the counting means during the voltage of the other end of the standard capacitor measured by the voltage measurement means being changed from an initial voltage after the first switching operation by a predetermined magnitude.

14 Claims, 6 Drawing Sheets

U.S. PATENT DOCUMENTS

| | | |
|---|---|---|
| 4,039,940 A | 8/1977 | Butler et al. |
| 4,115,764 A * | 9/1978 | Yamaguchi et al. ........ 340/530 |
| 5,424,650 A | 6/1995 | Frick |
| 5,977,803 A | 11/1999 | Tsugai |
| 6,278,283 B1 * | 8/2001 | Tsugai ........................ 324/678 |
| 6,466,036 B1 | 10/2002 | Philipp |
| 6,703,848 B1 * | 3/2004 | Cho ........................... 324/678 |
| 2003/0155936 A1 | 8/2003 | Wang |

FOREIGN PATENT DOCUMENTS

WO    WO 01/14895 A1    3/2001

* cited by examiner

CAPACITANCE DETECTION APPARATUS

CROSS REFERENCE TO RELATED APPLICATIONS

This application is based on and claims priority under 35 U.S.C. §119 to Japanese Patent Application 2003-341063, filed on Sep. 30, 2003, the entire content of which is incorporated herein by reference.

FIELD OF THE INVENTION

This invention generally relates to a capacitance detection apparatus, more particularly, this invention generally relates to a capacitance detection apparatus for detecting an unknown capacitance and a change of the capacitance of a capacitor to be measured.

BACKGROUND

A capacitance detection apparatus is adapted to a triggering detection for an unlocking operation in a system for controlling an open/close of a door for a vehicle, such as an automobile. Specifically, when a user approaches the vehicle, an ID code certification is performed between the vehicle and a mobile system of the user. Then, the vehicle becomes a permission mode for unlocking. After that, when the user touches an unlocking sensor (electrode) provided in an outside handle of the door of the vehicle, the vehicle detects a change of a capacitance of the unlocking sensor electrode, and performs the unlocking operation. In other words, the capacitance detection apparatus detects a user's intention for unlocking by an output of the unlocking sensor (the change of the capacitance). On the other hand, when the user touches a locking switch provided in the outside handle at the time the user departs from the vehicle, the vehicle performs a locking operation after performing the ID certification between the vehicle and the mobile system of the user. A replacement of the locking switch with the capacitance detection typed sensor similar to the unlocking sensor is expected.

A known art relating to a capacitance detection apparatus is described in U.S. Pat. No. 3,886,447A. The capacitance detection apparatus detects a capacitance of a capacitor to be measured by charging the capacitor to be measured while both ends of the capacitor to be measured are connected to an output terminal and a GND terminal of a DC voltage, and by transferring the charge stored at the capacitor to be measured to a known standard capacitor while the both ends of the capacitor to be measured are connected to both ends of the standard capacitor by a switch, and by referring to a voltage of the standard capacitor determined by a ratio of the capacitance of the capacitor to be measured to the standard capacitor.

Further, the other known art relating to a capacitance detection apparatus is described in U.S. Pat. No. 4,039,940A. The capacitance detection apparatus obtains a capacitance of a capacitor to be measured by repeatedly performing an operation for charging an unknown capacitor to be measured by a DC voltage source and an operation for transferring the stored charge of the capacitor to be measured to a standard capacitor, and by repeatedly performing an operation for charging a known reference capacitor by the DC voltage source and an operation for transferring the stored charge of the reference capacitor to the standard capacitor, and by referring a ratio of the number of repetition of a charge transfer operation from the capacitor to be measured to the number of repetition of a charge transfer operation from the reference capacitor until a voltage of the standard capacitor becomes a predetermined voltage.

Further, the other known art relating to a capacitance detection apparatus is described in U.S. Pat. No. 6,466,036A. The capacitance detection apparatus includes a DC voltage source connected to one end of a standard capacitor via an open/close switch S1, a capacitor to be measured, one end of the capacitor to be measured is connected to the other end of the standard capacitor via a sensor electrode, the other end of the capacitor to be measured is connected to ground or free space, an open/close switch S2 provided between the other end of the standard capacitor and ground, an open/close switch S3 provided between both ends of the standard capacitor, and a voltage measurement portion for measuring a voltage of one end of the standard capacitor. The capacitance detection apparatus detects a change of the capacitance of the capacitor to be measured by repeating following operation. First, the switch S2 and the switch S3 are closed to discharge the standard capacitor and the capacitor to be measured. Next, the switch S1 is closed to charge the standard capacitor and the capacitor to be measured by the DC voltage source. The voltage of the standard capacitor is raised to a voltage determined by a ratio of the capacitor to be measured to the standard capacitor. After that, the switch S1 is opened. Further, the switch S2 is closed to connect the other end of the standard capacitor to ground for discharging the capacitor to be measured. Finally, the voltage of the standard capacitor is measured by the voltage measurement portion. These operations are repeated until the voltage of the standard capacitor is raised to the predetermined voltage, and the number of repetition of the operations is counted. Then, by detecting increase or decrease of the number of repetition, the capacitance detection apparatus detects the change of the capacitance of the capacitor to be measured.

Further, the known art in U.S. Pat. No. 6,466,036A describes the capacitance detection apparatus including two capacitors to be measured, two voltage measurement portions provided at both sides of the standard capacitor symmetrically for measuring voltage between the open/close switch S1, the open/close switch S2, and both terminals of the standard capacitor. The respective one ends of the capacitors to be measured are connected to both ends of the standard capacitor via the sensor electrodes respectively. The other ends of the capacitors to be measured are connected to ground or free space. The capacitance detection apparatus detects the changes of the capacitances of the two capacitors to be measured by the detection circuit described above.

According to the known art described in U.S. Pat. No. 3,886,447A, the both ends of the capacitor to be measured should be switched by the pair of the switch. Therefore, the capacitance detection apparatus described in U.S. Pat. No. 3,886,447A can not be adapted to the unlocking sensor provided in the outside handle for the vehicle door having the sensor electrode and the other end of the capacitor to be measured is connected to ground or a low impedance portion such as free space equivalent to ground. Further, in case that there are a leak resistance parallel to the capacitor to be measured, in other words, the unlock sensor electrode is in highly humid condition or wet with water, the capacitor to be measured is discharged except when the both ends of the capacitor to be measured are connected to the DC voltage source, and the standard capacitor is discharged when the both ends of the capacitor to be measured are connected to the standard capacitor, which causes a sensitivity lowering.

According to the known art described in U.S. Pat. No. 4,039,940A, since only ground side terminal of the capacitor to be measured is switched, the capacitance detection apparatus can be adapted to the detection of the capacitor to be measured, the one side of the capacitor to be measured is connected to ground via the one sensor electrode. However, in case that there is the leak resistance parallel to the capacitor to be measured, the standard capacitor and the capacitor to be measured are discharged, which causes detection sensitivity lowering, similar to the known art described in U.S. Pat. No. 3,886,447A.

According to the known art described in U.S. Pat. No. 6,466,036A, a terminal used as a standard (the other end of the standard capacitor) when measuring the voltage of the standard capacitor is connected to the sensor electrode and changed largely. Then, the voltage of the sensor electrode side terminal should be kept and stabilized at ground voltage by closing the switch S2 while measuring the voltage of the standard capacitor. As a result, the voltage measurement of the standard capacitor becomes complex and the measured voltage becomes unstable. Further, two respective sensors for locking and for unlocking connected to ground in the narrow space such as the outside handle induces a parasitic capacitance between the both electrodes. Therefore, in the capacitance detection apparatus described in U.S. Pat. No. 6,466,036A, the capacitance of the one sensor electrode is influenced by the other sensor electrode being touched by the human body through the parasitic capacitance, which causes an error detection of the trigger of the locking.

According to the known arts described in U.S. Pat. No. 3,886,447A and U.S. Pat. No. 4,039,940A, after charging the capacitor to be measured by connecting the DC voltage source to the capacitor to be measured, the charge at the capacitor to be measured is transferred to the standard capacitor by disconnecting the capacitor to be measured from the DC voltage source, and by connecting the standard capacitor in parallel to the capacitor to be measured, which raises the voltage of the standard capacitor (so called a parallel circuit type). According to the known art described in U.S. Pat. No. 6,466,036A, the voltage of the standard capacitor is raised by applying the voltage from the DC voltage source to the standard capacitor and the capacitor to be measured connected in series, and charging the standard capacitor and the capacitor to be measured simultaneously (so called a series circuit type). The series circuit typed detection circuit has advantage over the parallel circuit typed detection circuit in regard to a large voltage increase ratio (sensitivity) of the standard capacitor by transferred charge transferred from the capacitor to be measured.

A need thus exists a capacitance detection apparatus with the series circuit typed detection circuit, which enables to measure the voltage of the standard capacitor with stability by simple structure. Further need thus exists a capacitance detection apparatus, which reduces an influence from the leak resistance causing sensitivity lowering even when there is the leak resistance at the capacitor to be measured. Further need thus exists a capacitance detection apparatus, which makes possible to prevent the detection error by detecting one of the two capacitors to be measured connected electrostatically each other through the parasitic capacitance without the influence from the other capacitor through the parasitic capacitance.

SUMMARY OF THE INVENTION

According to an aspect of the present invention, a capacitance detection apparatus includes a first open/close switch provided between both ends of a standard capacitor, one end of the standard capacitor being connected to a first voltage source, a second open/close switch provided between one end of a first capacitor to be measured and the other end of the standard capacitor, the other end of the first capacitor to be measured being connected to a second voltage source or free space, a third open/close switch provided between both ends of the first capacitor to be measured, a voltage measurement means for measuring voltage of the other end of the standard capacitor, a switch control means for performing a first switching control performing a first switching operation to open the first open/close switch after closing thereof, performing a second switching operation to open the second open/close switch after closing thereof, and a third switching operation to close the third open/close switch after closing thereof, wherein the second and third switching operations are repeatedly performed after the first switching operation, a counting means for counting the number of repetition of the second switching operation, and a judging means for judging a change of the capacitance of the first capacitor to be measured according to the number of repetition of the second switching operation, which is the number counted by the counting means during the voltage of the other end of the standard capacitor measured by the voltage measurement means being changed from an initial voltage after the first switching operation by a predetermined magnitude.

BRIEF DESCRIPTION OF THE DRAWINGS

The foregoing and additional features and characteristics of the present invention will become more apparent from the following detailed description considered with reference to the accompanying drawings, wherein.

DETAILED DESCRIPTION

First and second embodiments of the present invention will be explained with reference to the illustrations as follows.

Figure 1:
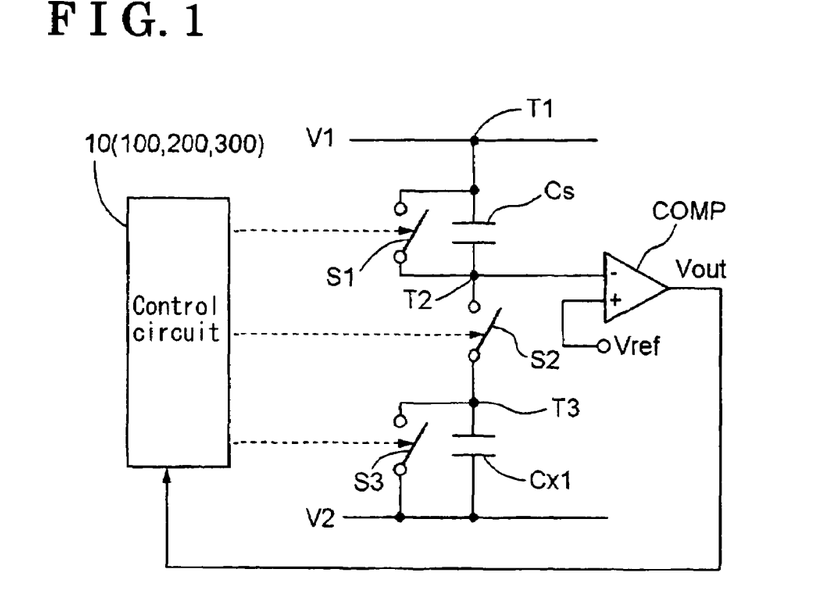
FIG. 1 shows a schematic circuit diagram of a capacitance detection apparatus according to a first embodiment of the present invention.

The first embodiment of the present invention will be explained as follows. As shown in FIG. 1, a capacitance detection apparatus includes a first open/close switch provided between both ends of a standard capacitor Cs, a second open/close switch provided between one end T3 of a first capacitor to be measured Cx1 and the other end T2 of the standard capacitor Cs, and a third open/close switch S3 provided between both ends T3, V2 of the first capacitor to be measured Cx1. One end of the standard capacitor Cs is connected to a first voltage source V1. The other end of the first capacitor to be measured Cx1 is connected to a second voltage source V2 or free space. The capacitance detection apparatus further includes a comparator COMP serving as a voltage measurement means for measuring a voltage at the other end T2 of the standard capacitor Cs. Here, the first voltage source V1 is an output of a constant-voltage circuit. The second voltage source V2 is an earth (ground). The free space is a low impedance voltage, which is equivalent to ground. A reference voltage Vref is connected to a positive terminal of the comparator COMP. The other end T2 of the standard capacitor Cs is connected to a negative terminal of the comparator COMP.

Further, the capacitance detection apparatus includes a control circuit 10 having a logical hardware circuitry or a microcomputer. The control circuit 10 outputs a driving signal to each open/close switches S1, S2, S3. An output signal Vout of the comparator COMP is inputted into the control circuit 10.

The control circuit 10 includes a switch control means 100 for performing a first switching control performing a first switching operation to open the first open/close switch S1 after closing thereof, performing a second switching operation to open the second open/close switch S2 after closing thereof, and performing a third switching operation to open the third open/close switch S3 after closing thereof, the second and third switching operations are repeatedly performed after the first switching operation, a counting means 200 for counting the number of repetition of the second switching operation, and a judging means 300 for judging a change of a capacitance of the first capacitor to be measured Cx1 based on the number of repetition of the second switching operation, which is the number counted by the counting means 200 during the voltage of the other end T2 of the standard capacitor Cs measured by the comparator COMP being changed from an initial voltage V1 after the first switching operation by a predetermined magnitude.

In other words, by closing the first open/close switch S1 by the first switching operation, the standard capacitor Cs is discharged and the voltage of the other end of the standard capacitor Cs becomes to an initial voltage equivalent to the voltage of the first voltage source V1. Here, an initial voltage of the other end T2 of the standard capacitor Cs is a voltage of the first voltage source V1. The reference voltage Vref is determined to be lower than the initial voltage V1 by the predetermined magnitude (the predetermined magnitude of the voltage=V1−Vref). Therefore, the output signal Vout of the comparator COMP becomes low level after the first switching operation. Next, the second switching operation and the third switching operation are repeatedly performed (either operation can be performed earlier). The second switching operation closes the second open/close switch S2 to connect the standard capacitor Cs to the first capacitor to be measured Cx1 in series. Then, a voltage difference between the first voltage source V1 and the second voltage source V2 or free space is applied between the standard capacitor Cs and the first capacitor to be measured Cx1 for charging the standard capacitor Cs and the first capacitor to be measured Cx1 simultaneously. By this charging, the voltage difference between the both ends of the standard capacitor Cs is increased by the amount of voltage change obtained by multiplying the capacitance ratio of the first capacitor to be measured Cx1 to the standard capacitor Cs to the voltage difference between the first voltage source and the second voltage source V2 or free space. Therefore, the voltage of the other end of the standard capacitor Cs is changed from the initial voltage. The third switching operation discharges the first capacitor to be measured Cx1 by closing the third open/close switch S3. After that, the second and third switching operations are repeatedly performed, which gradually increases the voltage between the both ends of the standard capacitor Cs. Here, the amount of increase per unit time becomes small gradually. Then, the voltage of the other end of the standard capacitor Cs changes gradually from the initial voltage. The number of repetition of the second switching operation when the voltage change achieves the predetermined magnitude of the voltage is stored. Specifically, when the voltage of the other end T2 of the standard capacitor Cs is lowered from the initial voltage V1 by the predetermined magnitude (V1−Vref), in other words, becomes lower than the reference voltage Vref, the counted value counted by the counting means 200 at the time that the output signal of the comparator COMP becomes high level from low level is stored.

Figure 2:
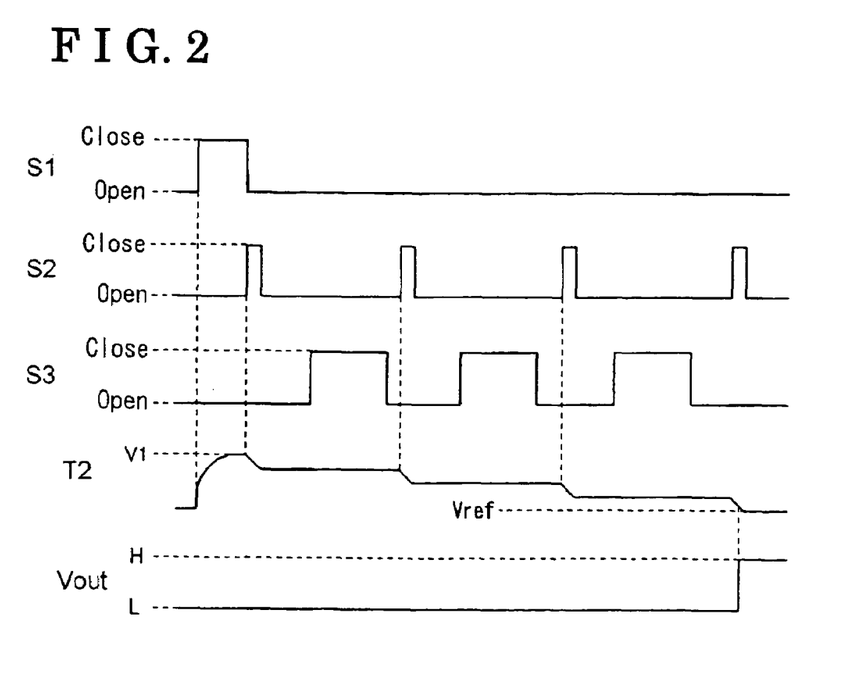
FIG. 2 shows a waveform chart showing operation of the circuit shown in FIG. 1.

After that, a process shown in FIG. 2, that is, an operation for obtaining the number of repetition during the voltage of the other end of the standard capacitor Cs being changed from the initial voltage by the predetermined magnitude performed by from the first to the third switching operations, is repeatedly performed after certain time period (some 100 ms, or the like). The counted value counted by the counting means 200 at the time that the output signal Vout of the comparator COMP becomes high level from low level in each process is stored. If the capacitance of the first capacitor to be measured Cx1 is changed before and after the time period, the number of repetition should not be changed. Then, if the number of repetition is not changed, specifically, if the counted value varies within the permissible range, for which detecting errors are considered, the capacitance of the first capacitor to be measured Cx1 is judged not to be changed. On the other hand, if the capacitance of the first capacitor to be measured Cx1 is changed, the number of repetition should be changed. Then, if the number of repetition is changed, specifically, if the changing of the counted value exceeds the permissible range, the capacitance of the first capacitor to be measured Cx1 is judged to be changed.

The voltage of the one end of the standard capacitor Cs as the standard of the voltage measurement of the other end of the standard capacitor Cs is connected to the first voltage source V1, which makes the voltage of the other end of the standard capacitor Cs stable. The other end of the standard capacitor Cs is connected to the first capacitor to be measured Cx1 only when the first capacitor to be measured Cx1 is charged by the second switching operation. The other end of the standard capacitor Cs is not connected to the first capacitor to be measured Cx1 during the voltage measurement, which makes the other end of the standard capacitor Cs high impedance. Accordingly, proper voltage measurement becomes possible by using a simple and high impedance amplifier, such as an operational amplifier, a comparator, or the like, as the voltage measurement means.

According to the embodiment of the present invention, the capacitance detection apparatus can measure the voltage of the standard capacitor Cs with stability by a simple structure even having the series circuit typed detection circuit.

Figure 3:
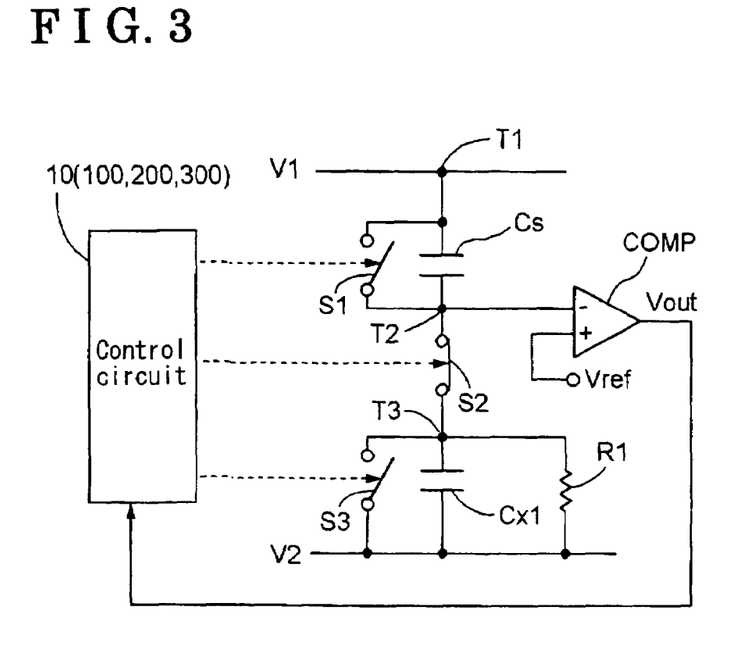
FIG. 3 shows a schematic circuit diagram of the circuit shown in FIG. 1 with a leak resistance at a first capacitor to be measured.
Figure 4:
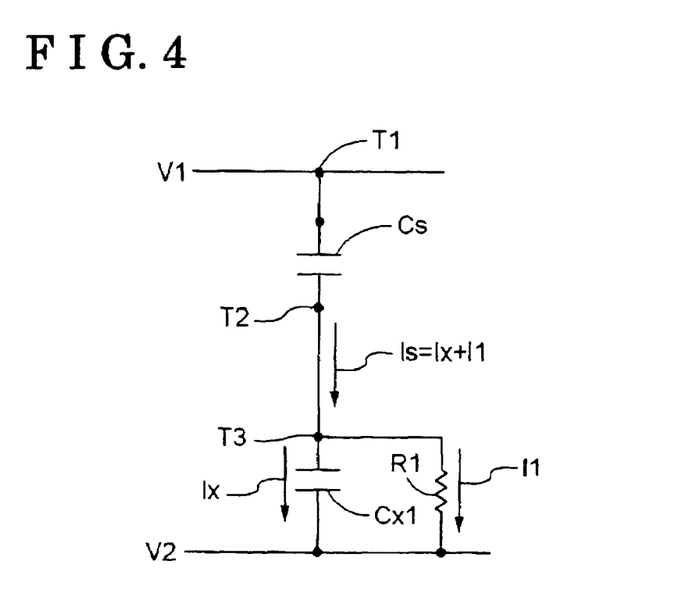
FIG. 4 shows a schematic circuit diagram showing the operation of the circuit shown in FIG. 1 when there is a leak resistance at a capacitor to be measured.

Next, a preferred embodiment for reducing an influence from a leak resistance R1, in case that there is the leak resistance R1 parallel to the first capacitor to be measured Cx1, will be explained as follows. As shown in FIGS. 3–4, when the second open/close switch S2 is closed, a charging current Ix having differential waveform flows through an on-state resistance of the second open/close switch S2 to charge the standard capacitor Cs and the first capacitor to be measured Cx1. Simultaneously, a regular current I1 flows through the leak resistance R1 to discharge an electric charge at the standard capacitor Cs (total current Is=Ix+I1). Accordingly, when closed time of the second open/close switch S2 becomes longer, decrease of the charge of the standard capacitor Cs by the regular current I1 becomes larger, which makes detection sensitivity lower.

Figure 5:
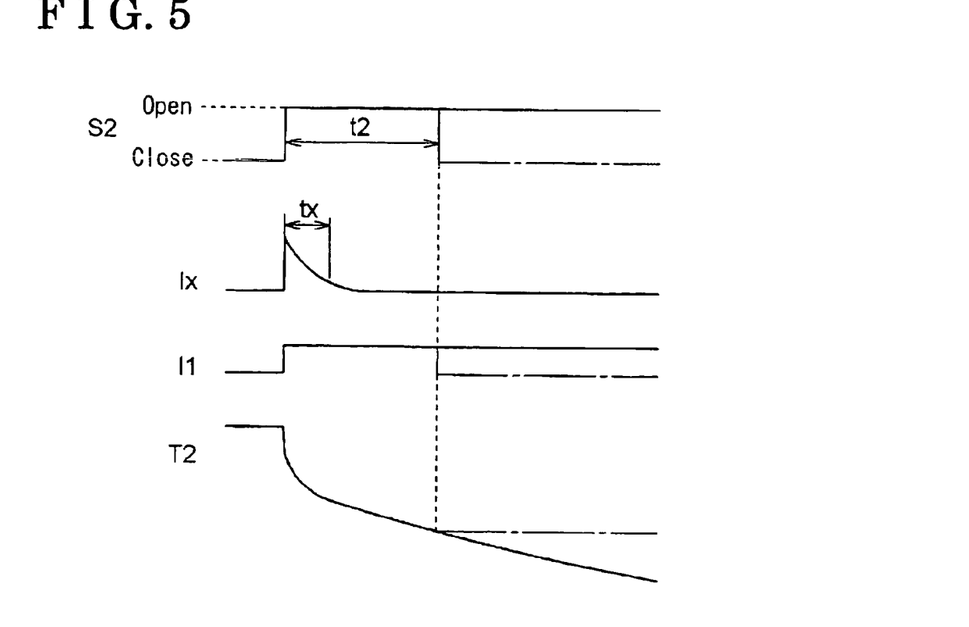
FIG. 5 shows a waveform chart showing the operation of the circuit shown in FIG. 3.

In order to reduce the detection sensitivity lowering, as shown in FIG. 5, the switch control means restricts the time t2 for closing the second open/close switch S2 in the second switching operation based on a time constant indicated by a product of the on-state resistance of the closed second open/close switch S2 and the capacitance of the first capacitor to be measured Cx1 to the time sufficient for charging the first capacitor to be measured Cx1 by the second switching operation. The required time for charging becomes longest when the capacitance of the first capacitor to be measured Cx1 is maximized. Normally, 3–5 times of the time constant indicated by the product of the on-state resistance of the closed second open/close switch S2 and the maximum of the capacitance of the first capacitor to be measured Cx1 is sufficient time for charging. Specifically, the time t2 that the second open/close switch S2 is closed is restricted to under about 3–5 times of the time constant.

Accordingly, even when there is a leak resistance at the first capacitor to be measured Cx1, the sensitivity lowering of the capacitance detection apparatus can be reduced.

A second embodiment of the present invention will be explained as follows.

Figure 6:
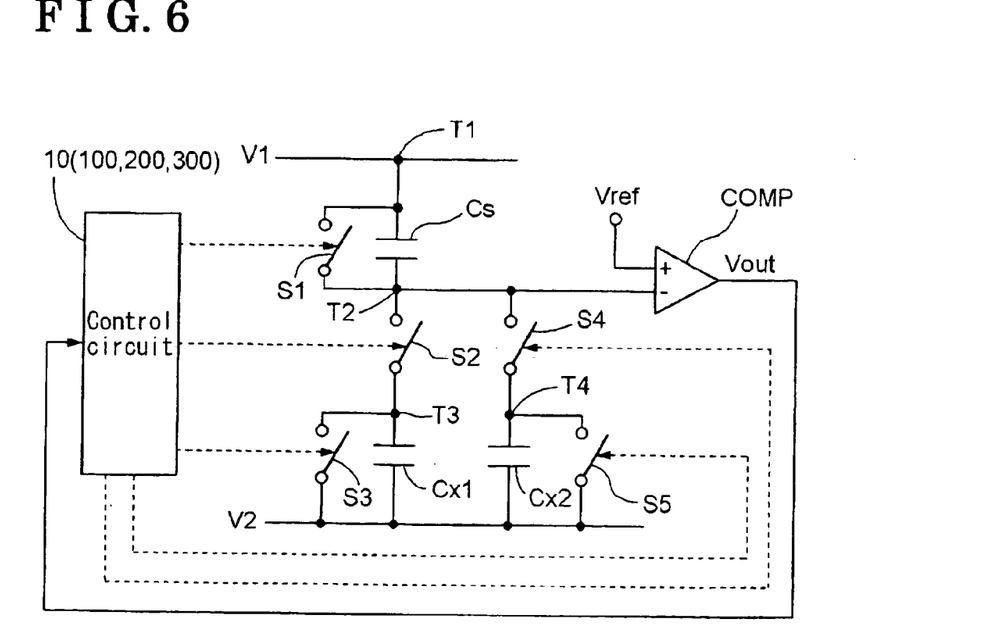
FIG. 6 shows a schematic circuit diagram of the capacitance detection apparatus according to a second embodiment of the present invention.

In the second embodiment, the capacitance detection apparatus includes two capacitors to be measured (the first capacitor to be measured Cx1 and a second capacitor to be measured Cx2). In the second embodiment, as shown in FIG. 6, the capacitance detection apparatus includes a fourth open/close switch S4 provided between an other end T4 of the second capacitor to be measured Cx2 and the other end T2 of the standard capacitor Cs, and a fifth open/close switch S5 provided between both ends T3, V2 of the second capacitor to be measured Cx2. One end of the second capacitor to be measured Cx2 is connected to the second voltage source V2 (serving as a third voltage source) or free space. In the embodiment, single voltage source V2 acts as both the second voltage source and the third voltage source.

Figure 7:
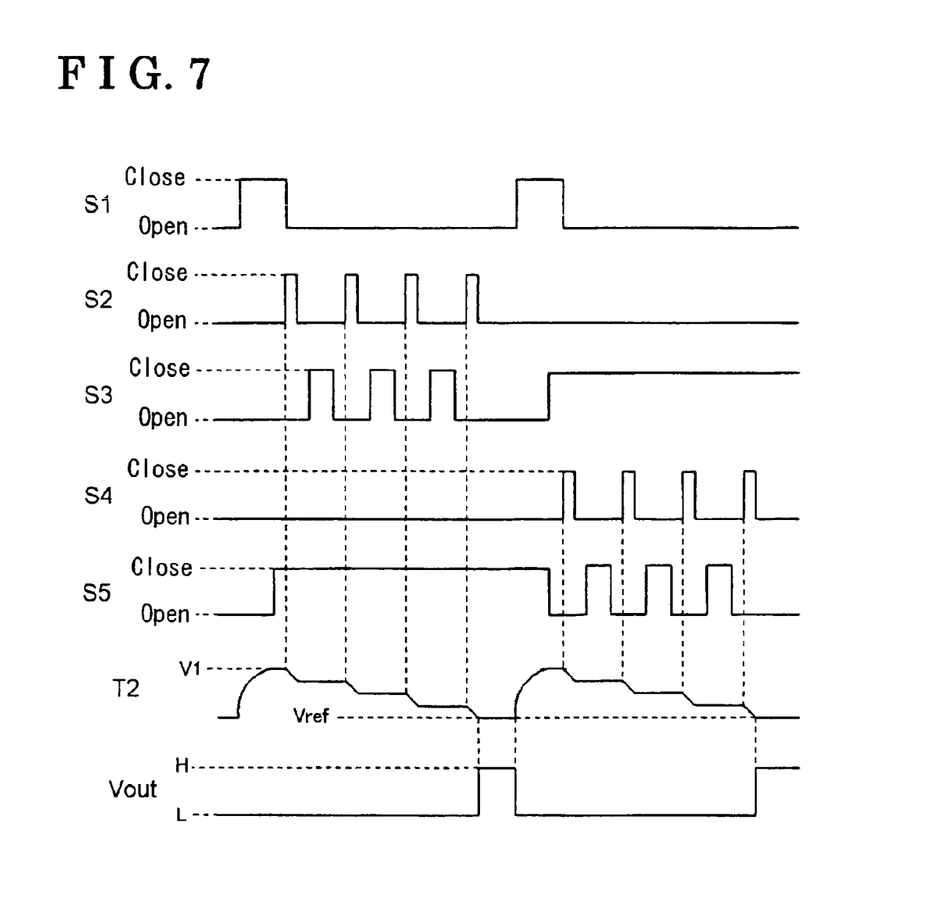
FIG. 7 shows a waveform chart showing an operation of a circuit shown in FIG. 6.

Then, as shown in FIG. 7, the switch control means 100 performs the second switching control performing the first switching operation to open the first open/close switch S1 after closing thereof, performing a fourth switching operation to open the fourth open/close switch S4 after closing thereof, and performing a fifth switching operation to open the fifth open/close switch S5 after closing thereof. The fourth and fifth switching operations are repeatedly performed after the first switching operation. Then, the counting means 200 counts the number of repetition of the fourth switching operation. After that, the judging means 300 judges a change of the capacitance of the second capacitor to be measured Cx2 based on the number of repetition of the fourth switch operation counted by the counting means 200 during the voltage of the other end T2 of the standard capacitor Cs measured by the comparator COMP being changed from the initial voltage V1 after the first switching operation by a determined magnitude (V1−Vref).

In this way, the other end of the standard capacitor Cs is made to be an initial voltage equivalent to the voltage of the first voltage source V1 by discharging the standard capacitor Cs by the first switching operation. Next, the fourth switching operation and the fifth switching operation are repeatedly performed (either operation can be performed earlier). The fourth switching operation closes the fourth open/close switch S4 to connect the standard capacitor Cs to the second capacitor to be measured Cx2 in series. The voltage between the first voltage source V1 and the second voltage source V2 or free space is applied between the standard capacitor Cs and the second capacitor to be measured Cx2 simultaneously for charging the standard capacitor Cs and the second capacitor to be measured Cx2. By this charging, the charged voltage between the both ends of the standard capacitor Cs is increased by the magnitude of the voltage change obtained by multiplying the capacitance ratio of the second capacitor to be measured Cx2 to the first capacitor to be measured Cx1 to the voltage difference between the first voltage source V1 and the second voltage source V2 or free space. Therefore, the voltage of the other end of the standard capacitor Cs is changed from the initial voltage. The fifth switching operation closes the fifth open/close switch S5 to discharge the second capacitor to be measured Cx2. After that, the fourth and fifth switching operations are repeatedly performed, which gradually increases the charged voltage between the both ends of the standard capacitor Cs. Here, the magnitude of voltage increase at one time becomes small gradually. Then, the voltage of the other end of the standard capacitor Cs is gradually changed from the initial voltage. The number of repetition of the fourth switching operation when the voltage change achieves the predetermined magnitude of the voltage is stored.

Here, the operation for obtaining the number of repetition during the voltage of the other end of the standard capacitor Cs being changed from the initial voltage by the predetermined magnitude is performed after certain period of time by the first, fourth and fifth switching operation. When the capacitance of the second capacitor to be measured Cx2 is not changed between before and after the certain period of time, the number of repetition should not be changed. On the other hand, if the capacitance of the second capacitor to be measured Cx2 is changed, the number of repetition should be changed. Then, the second capacitor to be measured Cx2 is not changed when the number of repetition is not changed, and the second capacitor to be measured Cx2 is changed when the number of repetition is changed.

Further, the voltage of the one end of the standard capacitor Cs as a standard of the voltage measurement of the other end of the standard capacitor Cs is connected to the first voltage source V1, which makes the voltage of the one end of the standard capacitor Cs stable. In addition, the other end of the standard capacitor Cs is connected to the second capacitor to be measured Cx2 only when the second capacitor to be measured Cx2 is charged by the fourth switching operation. Therefore, the other end of the standard capacitor Cs becomes high impedance during a voltage measurement. Accordingly, the proper voltage measurement becomes possible by using a simple amplifier having high impedance input, such as an operational amplifier, a comparator, or the like.

Accordingly, using common control scheme for a capacitance detection, which can prevent a complex scheme, the capacitance detection apparatus can easily detects two capacitors to be measured.

Here, if there is a leak resistance parallel to the second capacitor to be measured Cx2, in order to reduce the influence from the leak resistance, similar to the case of the first capacitor to be measured Cx1, the switch control means 100 restricts the closing time for the fourth open/close switch S4 by the fourth switch operation to sufficient time (3–5 times of the time constant tx) for charging the second capacitor to be measured Cx2 by the fourth switching operation based on the time constant indicated by a product between an on-state resistance of the closed fourth open/close switch S4 and a maximum of a capacitance of the second capacitor to be measured Cx2.

The fourth switching operation charges the standard capacitor Cs and the second capacitor to be measured Cx2 through the on-state resistance of the closed fourth open/close switch S4. On the other hand, if there is the leak resistance at the second capacitor to be measured Cx2, the second capacitor to be measured Cx2 is discharged through the leak resistance of the second capacitor to be measured Cx2. Then, the closing time of the fourth open/close switch S4 is restricted to the required time for charging the second capacitor to be measured Cx2. Normally, certain times (3–5 times) of the time constant indicated by the product of the on-state resistance at the closed fourth open/close switch S4 and the maximum of the capacitance of the second capacitor to be measured Cx2 is sufficient for charging.

Accordingly, even when there is the leak resistance at the second capacitor to be measured Cx2, the influence, which induces sensitivity lowering of the capacitance detection apparatus, can be reduced.

Figures 8, 9:
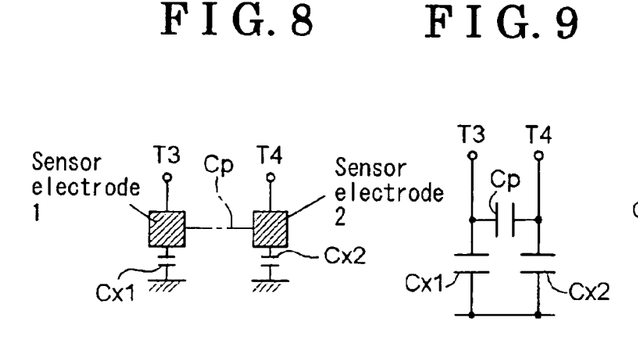
FIG. 8 shows a partial circuit diagram showing the circuit shown in FIG. 6 when there is a parasitic capacitance between a capacitor to be measured and a second capacitor to be measured.
FIG. 9 shows a partial circuit diagram showing the circuit shown in FIG. 6 with a parasitic capacitance between a capacitor to be measured and a second capacitor to be measured.
Figure 10:
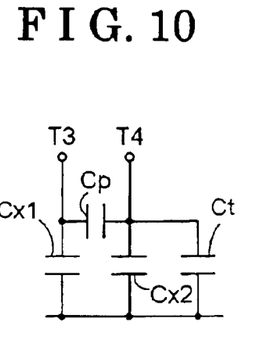
FIG. 10 shows a partial circuit diagram showing a parasitic capacitance of the circuit shown in FIG. 6.

Further, as shown in FIGS. 8–10, the one end 13 as a detection terminal of the first capacitor to be measured Cx1 (specifically a sensor electrode 1) and the one end T4 as a detection terminal of the second capacitor to be measured Cx2 (specifically a sensor electrode 2) can be electrostatically coupled through a parasitic capacitance. In this case, the capacitance C3 seen from the detection terminal T3 becomes summation of a capacitance of the capacitor to be measured Cx1 and a parasitic capacitance Cp and the capacitance of the second capacitor to be measured Cx2 connected in series, as shown in (eq. 1).

$$C3 = Cx1 + CpCx2/(Cp+Cx2) \quad \text{(eq. 1)}$$

Here, when the capacitor to be measured Cx2 changes, the capacitance C3 seen by the detecting terminal T3 changes to the capacitance that the magnitude of the capacitance change Ct is added to the second capacitor to be measured Cx2 as shown in (eq. 2).

$$C3 = Cx1 + Cp(Cx2+Ct)/(Cp+Cx2+Ct) \quad \text{(eq. 2)}$$

Here, while detection of the first capacitor to be measured Cx1 and the second capacitor to be measured Cx2, in order to avoid a mutual influence between the first capacitor to be measured Cx1 and the second capacitor to be measured Cx2, the switch control means 100 keeps the fifth open/close switch S5 to be closed during the switch control, and the switch control means 100 keeps the third open/close switch S3 to be closed while the second switching control (reference to FIG. 7). As a result, for example, the capacitance C3 seen from the detection terminal T3 of the first capacitor to be measured Cx1 becomes a summation of the capacitance of the first capacitor to be measured Cx1 and the parasitic capacitance Cp as shown in (eq. 3), which is not influenced by the second capacitor to be measured Cx2. Similarly, the capacitance C4 seen from the detection terminal T4 of the second capacitor to be measured Cx2 becomes a summation of the capacitance of the second capacitor to be measured Cx2 and the parasitic capacitance Cp as shown in (eq. 4), which is not influenced by the first capacitor to be measured Cx1.

$$C3 = Cx1 + Cp$$

$$C4 = Cx2 + Cp$$

Accordingly, for detecting the one capacitance of the two capacitors to be measured electrostatically coupled by the parasitic capacitance, by eliminating the influence of the other capacitance through the parasitic capacitance, the detection error of the capacitance detection apparatus can be prevented.

Figure 11:
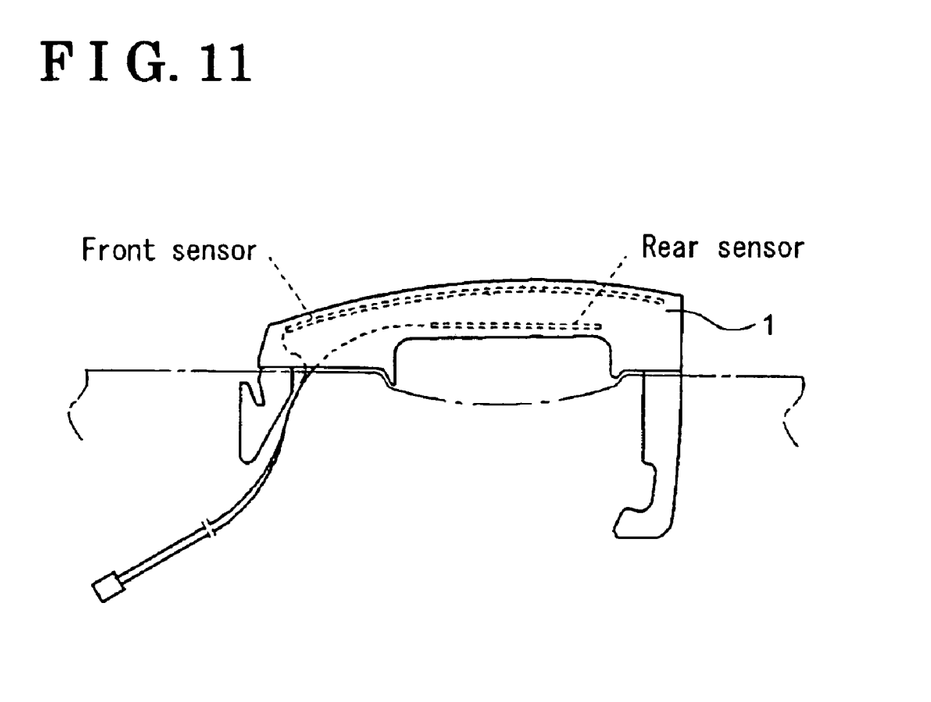
FIG. 11 shows a cross-sectional view of an arrangement of a sensor electrode of a door handle apparatus for a vehicle having the capacitance detection apparatus according to the second embodiment of the present invention.
Figure 12:
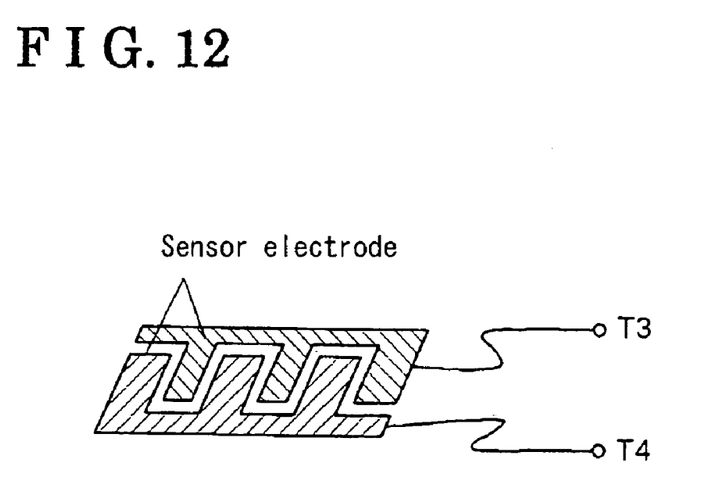
FIG. 12 shows a pattern diagram of an arrangement of a sensor electrode of a door handle apparatus for a vehicle having the capacitance detection apparatus according to the second embodiment of the present invention.

Next, as a specific example of FIGS. 8–10, a specific structure with a rear sensor provided at rear surface of a door handle 1 corresponding to the sensor electrode 1 and a front sensor provided at the front surface of the door handle 1 corresponding to the sensor electrode 2, for detecting trigger for unlocking and locking a door for a vehicle is shown in FIG. 11. FIG. 11 shows a specific structure including two sensor electrodes and a schematic diagram showing connection between the electrodes.

Figure 13:
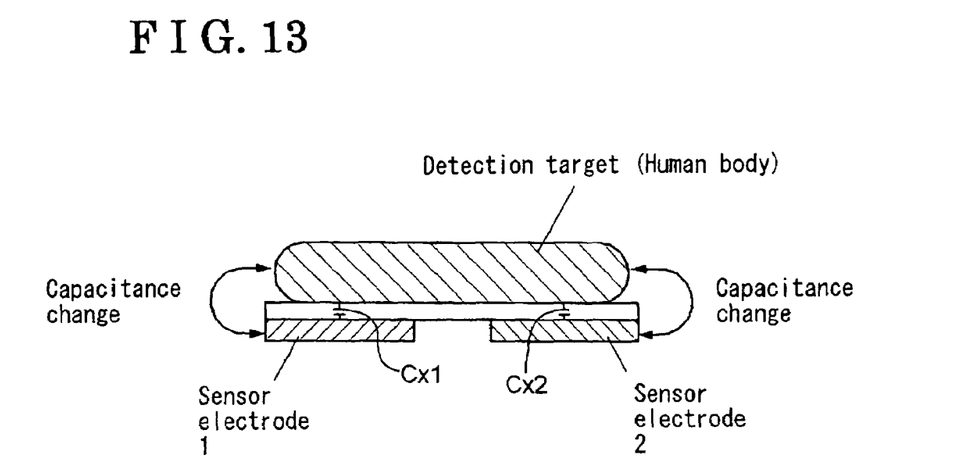
FIG. 13 shows a cross-sectional view showing an operation of a human body detection apparatus having the capacitance detection apparatus according to the second embodiment of the present invention.
Figure 14:
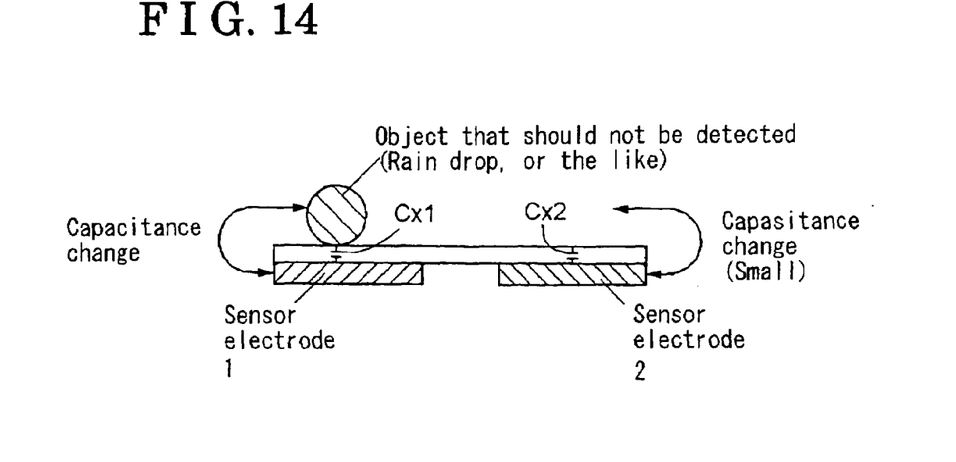
FIG. 14 shows a cross-sectional view showing an operation of the human body detection apparatus having the capacitance detection apparatus according to the second embodiment of the present invention.

Further, as shown in FIGS. 13–14, two sensors, the sensor electrode 1 and the sensor electrode 2, provided close together at the door handle, or the like, enables to detect an approach of the object to be detected (human body, or the like) while avoiding an error operation caused by raindrops, or the like. In other words, when both two sensors detect capacitance change, it is judged that human was approaching because human can cover whole area of two sensor electrodes. On the other hand, if an object not to be detected, such as raindrops, approaches one sensor electrode, and a capacitance change is detected by the one sensor electrode, it is judged that the approaching object was not the object to be detected (human body) because a capacitance change detected by the other sensor electrode is small.

The change of the first capacitor to be measured Cx1 and the second capacitor to be measured Cx2 can be judged by the structure not only that the other end of the second capacitor to be measured Cx2 is connected to the same voltage source as the first capacitor to be measured Cx1 or free space, but also that the other end of the second capacitor to be measured Cx2 is connected to a third voltage source V3, different from the voltage source V2, or free space.

The capacitance detection apparatus was adapted to, but not limited to, a triggering detection for locking and unlocking for an open/close control system of the vehicle door as in the embodiments. The capacitance detection apparatus can be adapted to other applications.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the sprit of the present invention. Accordingly, it is expressly intended that all such variations, changes and equivalents which fall within the spirit and scope of the present invention as defined in the claims, be embraced thereby.

What is claimed is:

1. A capacitance detection apparatus, comprising:
   a first open/close switch provided between both ends of a standard capacitor, one end of the standard capacitor being connected to a first voltage source;
   a second open/close switch provided between one end of a first capacitor to be measured and the other end of the standard capacitor, the other end of the first capacitor to be measured being connected to a second voltage source or free space;
   a third open/close switch provided between both ends of the first capacitor to be measured;
   a voltage measurement means for measuring voltage of the other end of the standard capacitor;
   a switch control means for performing a first switching control performing a first switching operation to open the first open/close switch after closing thereof, performing a second switching operation to open the second open/close switch after closing thereof, and a third switching operation to close the third open/close switch after closing thereof, wherein the second and third switching operations are repeatedly performed after the first switching operation;
   a counting means for counting the number of repetition of the second switching operation; and
   a judging means for judging a change of the capacitance of the first capacitor to be measured according to the number of repetition of the second switching operation, which is the number counted by the counting means during the voltage of the other end of the standard capacitor measured by the voltage measurement means being changed from an initial voltage after the first switching operation by a predetermined magnitude.

2. The capacitance detection apparatus according to claim 1, further comprising:
   a fourth open/close switch provided between one end of a second capacitor to be measured and the other end of the standard capacitor, the other end of the second capacitor to be measured being connected to a third voltage source or free space;
   a fifth open/close switch provided between both ends of the second capacitor to be measured;
   the switch control means performing a second switch control performing the first switching operation to open the first open/close switch after closing thereof, performing a fourth switching operation to open the fourth open/close switch after closing thereof, and a fifth switching operation to close the fifth open/close switch after closing thereof, wherein the fourth and fifth switching operations are repeatedly performed after the first switching operation;
   the counting means counting the number of repetition of the fourth switching operation; and
   the judging means judging a change of the capacitance of the second capacitor to be measured according to the number of repetition of the fourth switching operation, which is the number counted by the counting means during the voltage of the other end of the standard capacitor measured by the voltage measurement means being changed from the initial voltage after the first switching operation by the predetermined magnitude.

3. The capacitance detection apparatus according to claim 2, wherein
   the switch control means restricts a closing time of the second open/close switch by the second switching operation to a required time for charging the first capacitor to be measured by the second switching operation based on a time constant indicated by a product of an on-state resistance of the closed second open/close switch and a maximum capacitance of the capacitor to be measured.

4. The capacitance detection apparatus according to claim 3, wherein
   the switch control means restricts a closing time of the fourth open/close switch at the fourth switching operation to a required time for charging the second capacitor to be measured by the fourth switching operation based on a time constant indicated by a product of an on-state resistance of the closed fourth open/close switch and a maximum capacitance of the second capacitor to be measured.

5. The capacitance detection apparatus according to claim 4, wherein
   the required time for charging is restricted to equal to or less than 5 times of the time constant.

6. The capacitance detection apparatus according to claim 3, wherein
   the required time for charging is restricted to equal to or less than 5 times of the time constant.

7. The capacitance detection apparatus according to claim 2, wherein
   the switch control means restricts a closing time of the fourth open/close switch at the fourth switching operation to a required time for charging the second capacitor to be measured by the fourth switching operation based on a time constant indicated by a product of an on-state resistance of the closed fourth open/close switch and a maximum capacitance of the second capacitor to be measured.

8. The capacitance detection apparatus according to claim 7, wherein
   the required time for charging is restricted to equal to or less than 5 times of the time constant.

9. The capacitance detection apparatus according to claim 2, wherein
   the switch control means keeps the fifth open/close switch closed during the switch control, and keeps the third open/close switch closed during the second switch control.

10. The capacitance detection apparatus according to claim 2, wherein
    the judging means judges an absence of an object to be detected when the capacitance change is detected at only one of the first capacitor to be measured and the second capacitor to be measured from the measurement of the capacitance changes thereof.

11. The capacitance detection apparatus according to claim 1, wherein
the switch control means restricts a closing time of the second open/close switch by the second switching operation to a required time for charging the first capacitor to be measured by the second switching operation based on a time constant indicated by a product of an on-state resistance of the closed second open/close switch and a maximum capacitance of the first capacitor to be measured.

12. The capacitance detection apparatus according to claim 11, wherein
the switch control means restricts a closing time of the fourth open/close switch at the fourth switching operation to a required time for charging the second capacitor to be measured by the fourth switching operation based on a time constant indicated by a product of an on-state resistance of the closed fourth open/close switch and a maximum capacitance of the second capacitor to be measured.

13. The capacitance detection apparatus according to claim 12, wherein
the required time for charging is restricted to equal to or less than 5 times of the time constant.

14. The capacitance detection apparatus according to claim 11, wherein
the required time for charging is restricted to equal to or less than 5 times of the time constant.

* * * * *